(12) United States Patent
Donkers et al.

(10) Patent No.: US 10,157,809 B2
(45) Date of Patent: Dec. 18, 2018

(54) SEMICONDUCTOR DEVICE AND METHOD OF MAKING A SEMICONDUCTOR DEVICE WITH PASSIVATION LAYERS PROVIDING TUNED RESISTANCE

(71) Applicant: Nexperia B.V., Nijmegen (NL)

(72) Inventors: Johannes Josephus Theodorus Marinus Donkers, Valkenswaard (NL); Godefridus Adrianus Maria Hurkx, Best (NL); Jeroen Antoon Croon, Waalre (NL); Mark Andrzej Gajda, Hazel Grove (GB); Jan Sonsky, Leuven (BE)

(73) Assignee: Nexperia BV, Nijmegen (NL)

( * ) Notice: Subject to any disclaimer, the term of this patent is extended or adjusted under 35 U.S.C. 154(b) by 0 days.

(21) Appl. No.: 15/356,519

(22) Filed: Nov. 18, 2016

(65) Prior Publication Data

US 2017/0170089 A1    Jun. 15, 2017

(30) Foreign Application Priority Data

Dec. 10, 2015 (EP) .................................... 15199187

(51) Int. Cl.
  *H01L 23/31* (2006.01)
  *H01L 23/29* (2006.01)
  (Continued)

(52) U.S. Cl.
  CPC .......... *H01L 23/3171* (2013.01); *H01L 21/56* (2013.01); *H01L 23/291* (2013.01);
  (Continued)

(58) Field of Classification Search
  CPC ............. H01L 29/1029; H01L 29/7787; H01L 29/2003; H01L 29/4236; H01L 29/41766; H01L 29/0615; H01L 29/66462; H01L 29/452; H01L 29/872; H01L 29/7786; H01L 29/401; H01L 29/402; H01L 29/423; H01L 21/31111; H01L 21/28581; H01L 29/66431; H01L 29/778–29/7789; H01L 2924/13064; H01L 29/122–29/127; H01L 29/15–29/158
  See application file for complete search history.

(56) References Cited

U.S. PATENT DOCUMENTS 8,962,461 B2   2/2015   Hurkx et al.
9,331,155 B2   5/2016   Donkers et al.
(Continued)

FOREIGN PATENT DOCUMENTS

WO       2013108844 A1    7/2013

OTHER PUBLICATIONS

Extended European Search Report for Patent Appln. No. 15199187.4 (dated Jun. 21, 2016).
(Continued)

*Primary Examiner* — Thanh Y Tran
(74) *Attorney, Agent, or Firm* — Ohlandt, Greeley, Ruggiero & Perle, L.L.P.

(57) ABSTRACT

A semiconductor device and a method of making the same are disclosed. The device includes a substrate including an AlGaN layer located on a GaN layer for forming a two dimensional electron gas at an interface between the AlGaN layer and the GaN layer. The device also includes a plurality of electrical contacts located on a major surface of the substrate. The device further includes a plurality of passivation layers located on the major surface of the substrate. The plurality of passivation layers includes a first passivation layer of a first passivation material contacting a first area of the major surface and a second passivation layer of a second passivation material contacting a second area of the major surface. The first and second passivation materials are different passivation materials. The different passivation materials may be compositions of silicon nitride that include different proportions of silicon.

14 Claims, 5 Drawing Sheets

(51) Int. Cl.
H01L 29/66 (2006.01)
H01L 29/778 (2006.01)
H01L 29/872 (2006.01)
H01L 29/20 (2006.01)
H01L 21/56 (2006.01)
H01L 29/205 (2006.01)
H01L 29/40 (2006.01)

(52) U.S. Cl.
CPC ...... *H01L 23/3192* (2013.01); *H01L 29/2003* (2013.01); *H01L 29/205* (2013.01); *H01L 29/66212* (2013.01); *H01L 29/66462* (2013.01); *H01L 29/7786* (2013.01); *H01L 29/7787* (2013.01); *H01L 29/872* (2013.01); *H01L 29/402* (2013.01)

(56) References Cited

U.S. PATENT DOCUMENTS

| | | | |
|---|---|---|---|
| 9,391,187 | B2 | 7/2016 | Hurkx et al. |
| 2010/0155779 | A1 | 1/2010 | Murase et al. |
| 2013/0313564 | A1* | 11/2013 | Okada ................ H01L 21/8252 257/76 |
| 2013/0341678 | A1* | 12/2013 | Green ............... H01L 21/31111 257/192 |
| 2014/0239346 | A1* | 8/2014 | Green ................ H01L 27/0629 257/192 |
| 2014/0284613 | A1 | 9/2014 | Kuraguchi et al. |
| 2015/0123168 | A1* | 5/2015 | Green ................ H01L 27/0629 257/192 |
| 2015/0132932 | A1* | 5/2015 | Green ............... H01L 21/31111 438/570 |
| 2015/0295051 | A1* | 10/2015 | Donkers ............... H01L 29/205 257/76 |
| 2017/0345812 | A1* | 11/2017 | Chou ................. H01L 27/0255 |

OTHER PUBLICATIONS

Uren, M. J. et al. "Intentionally Carbon-Doped AlGaN/GaN HEMTs: Necessity for Vertical Leakage Paths," IEEE Electron Device Letters, vol. 35, No. 3, pp. 327-329 (Mar. 2014).

Croon, J.A. et al. "Impact of the backside potential on the current collapse of GaN SBDs and HEMTs", Proc. ISPSD, pp. 365-368 (2015).

* cited by examiner

SEMICONDUCTOR DEVICE AND METHOD OF MAKING A SEMICONDUCTOR DEVICE WITH PASSIVATION LAYERS PROVIDING TUNED RESISTANCE

CROSS-REFERENCE TO RELATED APPLICATIONS

This application claims the priority under 35 U.S.C. § 119 of European Patent application no. 15199187.4, filed on Dec. 10, 2015, the contents of which are incorporated by reference herein.

BACKGROUND

The present specification relates to a semiconductor device and to a method of making a semiconductor device.

In recent years, GaN/AlGaN high electron mobility transistors and GaN/AlGaN Schottky diodes have drawn a lot of attention regarding their potential to replace Si or SiC for use as High Voltage (HV) devices.

Devices of this kind often include a passivation layer that may be used to suppress the formation of interface states at a major surface of the substrate. During operation of the device, these surface states may be charged, leading to changes in the charge balance. For applications that involve switching, this may translate into differences between the static condition and the switching condition. During switching, charge trapping can reduce the current or increase the on-state resistance of the device. This degradation of the electric performance may be referred to as current-collapse in high voltage devices or dispersion in high frequency devices.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising:

a substrate including an AlGaN layer located on a GaN layer for forming a two dimensional electron gas at an interface between the AlGaN layer and the GaN layer;

a plurality of electrical contacts located on a major surface of the substrate; and a plurality of passivation layers located on the major surface of the substrate, the plurality of passivation layers comprising a first passivation layer comprising a first passivation material contacting a first area of the major surface and a second passivation layer comprising a second passivation material contacting a second area of the major surface, wherein the first and second passivation materials are different passivation materials.

According to another aspect of the present disclosure, there is provided a method of making a semiconductor device, the method comprising:

providing a substrate including an AlGaN layer located on a GaN layer for forming a two dimensional electron gas at an interface between the AlGaN layer and the GaN layer;

forming a plurality of electrical contacts located on a major surface of the substrate; and forming a plurality of passivation layers located on the major surface of the substrate, the plurality of passivation layers comprising a first passivation layer comprising a first passivation material contacting a first area of the major surface and a second passivation layer comprising a second passivation material contacting a second area of the major surface, wherein the first and second passivation materials are different passivation materials.

Part of the trapping that may give rise to current collapse or dispersion in a semiconductor device (e.g. a HEMT or Schottky diode having an AlGaN layer located on a GaN layer for forming a two dimensional electron gas (hereinafter also referred to as "2DEG") at an interface between the AlGaN layer and the GaN layer) may occur in the semiconductor part below the 2DEG. The amount of trapping in this region may depend on the resistance of leakage paths in the semiconductor, particularly across a depletion region that forms below the 2DEG. This resistance may be altered by using a different passivation material on top of the semiconductor. However, decreasing the amount of trapping by changing the resistivity of the local leakage path in this way may lead to an increase in leakage current. In other words, leakage current and current collapse/dispersion may be traded-off against each-other by changing the passivation material on top of the semiconductor. In accordance with embodiments of this disclosure, the provision of a plurality of passivation layers comprising different passivation materials contacting different areas of the major surface of a substrate of the device may allow optimisation of the local resistance of the leakage paths. This may allow the above mentioned trade-off to be optimised, to reduce the amount of current-collapse without increasing the leakage current.

In one example, the first area is adjacent a first of the electrical contacts on the major surface and the second area is nonadjacent the first of the electrical contacts on the major surface. The first area may substantially surround the first of the electrical contacts on the major surface. The second area may, for instance, incorporate one or more other contacts of the device (e.g. a source contact and/or a gate contact of a HEMT, or the anode of the Schottky diode).

The first passivation layer may be asymmetrically arranged with respect to the first of the electrical contacts. The first passivation layer that is asymmetrically arranged in this way may include an extension located on one side of the first electrical contact. The extension may extend toward another electrical contact of the device.

The first area may include one or more islands located between two of the electrical contacts of the device.

The first electrical contact may be a drain contact of the device (e.g. where the device is a High Electron Mobility Transistor (HEMT)). For the purposes of this disclosure, the electron mobility in a High Electron Mobility Transistor (HEMT) may be in the range 1000-3000 cm^2/V/s or in the range 1000-2000 cm^2/V/s.

The first electrical contact may be a cathode of the device (for instance, where the device is a Schottky diode).

At least some of the passivation layers may comprise silicon nitride. For instance, the different passivation materials may comprise compositions of silicon nitride that include different proportions of silicon.

In one example, one of the passivation materials (e.g. the second passivation material) may be stoichiometric silicon nitride and another of the passivation materials (e.g. the first passivation material) may be a composition of silicon nitride that is more silicon rich than stoichiometric silicon nitride.

The passivation layers may overlap in at least some locations on the major surface. Where the passivation layers overlap, only one of the passivation layers may contact the major surface of the substrate.

The electrical contacts of the device may extend through openings in the passivation layers to make contact with the substrate.

The major surface of the substrate may be a surface of the AlGaN layer or a surface of a GaN cap layer located on the AlGaN layer.

A device according to an embodiment of this disclosure may operate at high voltages (e.g. voltages in the range 200-1000V) and/or at high frequencies (e.g. frequencies in the range 1 kHz-100 MHz). For instance, power conversion applications of grid voltage to appliance voltage using power factor correction (PFC) boost converters and/or resonant DC/DC convertors may require power transistors operating in the range 200V to 800V. The operating frequencies may be in the range 10 kHz to 100 MHz.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Embodiments of the present disclosure may provide a semiconductor device and a method of making the same. The device may include a substrate including an AlGaN layer located on a GaN layer. A two dimensional electron gas ("2DEG") may form at an interface between the AlGaN layer and the GaN layer. A current flowing within this 2DEG may form the basis for the operation of the device. The device may, for instance, be a High Electron Mobility Transistor (HEMT) or a Schottky diode. The device may include a plurality of electrical contacts located on a major surface of the substrate. The contacts may, for instance include the source, gate and drain of a HEMT or the cathode and anode of a Schottky diode.

The device may further include a plurality of passivation layers located on the major surface of the substrate. The major surface may, for instance, be the surface of the AlGaN layer, or may be the surface of a GaN cap layer that may be located on the AlGaN layer. As described in more detail below, different passivation layers of the device may contact different areas of the major surface. In particular, a first passivation layer may contact a first area of the major surface and a second passivation layer may contact a second area of the major surface. The passivation layers may comprise different passivation materials for adjusting the local resistance of the leakage paths in the area that a given passivation layer contacts the major surface. This may allow spatial optimisation of the above mentioned trade-off, to reduce the amount of current-collapse without increasing the leakage current. For instance, the first passivation layer may comprise a first passivation material and the second passivation layer may comprise a second, different passivation material. The first passivation layer may be located adjacent a source and/or drain of a HEMT, or adjacent a cathode of a Schottky diode.

Figure 1:
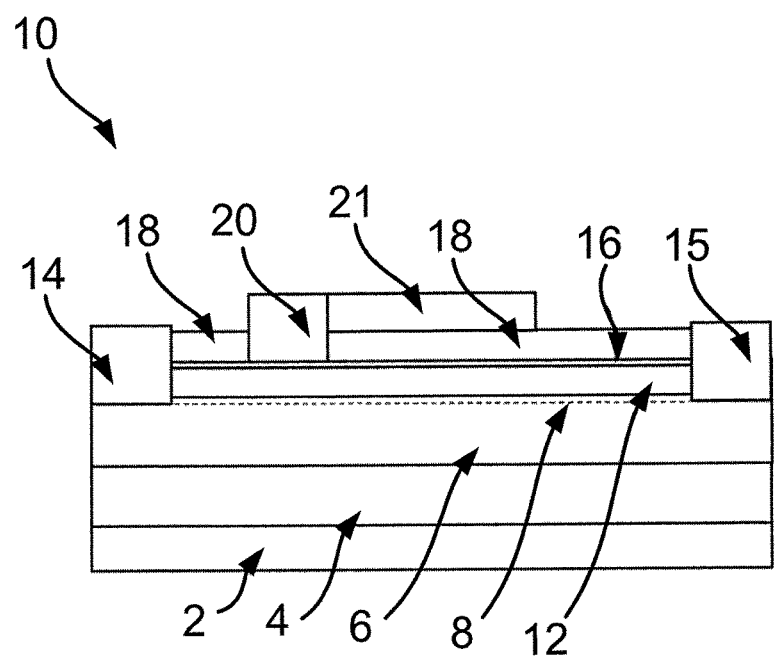
FIG. 1 shows an example of a High Electron Mobility Transistor (HEMT)

FIG. 1 shows an example of a semiconductor device 10 comprising a High Electron Mobility Transistor (HEMT). The device includes a substrate 2 having including an AlGaN layer 12 located on a GaN layer 6. A 2DEG 8 may form at an interface between the AlGaN layer 12 and the GaN layer 6. The substrate may also include one or more buffer layers 4 (comprising e.g. GaN), which may function to match the lattice of the GaN layer 6 to the underlying part of the substrate 2, which may, for instance, comprise silicon, silicon carbide, a glass or a ceramic. In this example, the substrate 2 also includes a GaN cap layer 16 located on the GaN layer 12. In this example, the upper surface of the GaN cap layer 16 forms a major surface of the substrate 2.

The device 10 in FIG. 1 further includes a plurality of contacts including a source contact 14, a drain contact 15 and a gate contact 20. During operation of the device, a potential applied to the gate contact 20 may be used to modulate the current flowing between the source contact 14 and the drain contact 15 of the device 10. The source contact 14 and drain contact 15 are ohmic contacts. In this example, the gate contact 20 is a Schottky contact that directly contacts the major surface of the substrate 2. In other examples, the gate contact 20 may be insulated from the major surface of the substrate 2 (devices of this kind are referred to as Metal Insulator Semiconductor High Electron Mobility Transistors (MISHEMTs)). The contacts may be metallic, and may be separated from each other by a dielectric layer 18. In this example, the gate 20 includes a field plate 21, and the dielectric layer 18 also serves to isolate the field plate from the underlying parts of the device 10. The dielectric layer 18 also serves as a passivation layer for the device 10.

Although embodiments of this disclosure are, for illustrative purposes, described in the context of a High Electron Mobility Transistors (HEMT), it will be appreciated that this disclosure is also applicable to other devices, such as Schottky diodes. A Schottky diode may be thought of as a HEMT without a source contact (such that the gate contact corresponds to the anode of the diode and the drain contact corresponds to the cathode).

In operation, a device 10 of the kind shown in FIG. 1 may be switched between an off state, in which it blocks a high drain-to-source voltage while having a low leakage current, and an on-state, in which it carries a high current at a low voltage.

Figure 2:
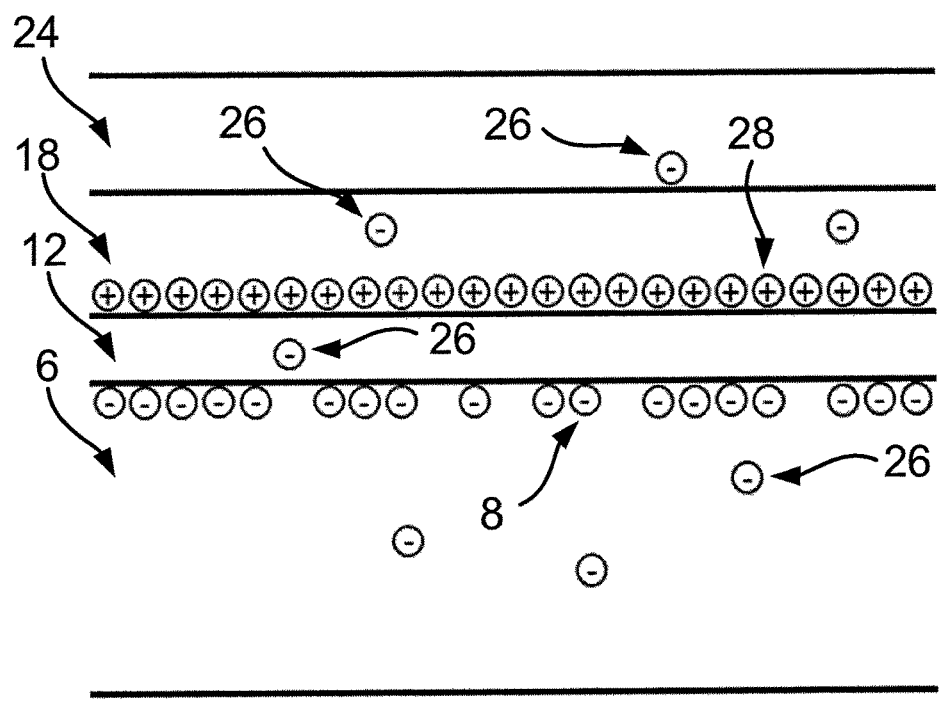
FIG. 2 illustrates the effects of charge trapping in a device of the kind shown in FIG. 1.

FIG. 2 shows a part of a device 10 of the kind shown in FIG. 1 in more detail. This part includes the GaN layer 6 and the AlGaN layer 12. The 2DEG 8 is shown to be located at the interface between the GaN layer 6 and the AlGaN layer 12. The optional GaN cap layer 16 discussed above in relation to FIG. 1 is not shown in FIG. 2. FIG. 2 also shows the dielectric layer 18, which forms a passivation layer, and one or more overlying further dielectric layers 24.

As illustrated in FIG. 2, under static DC conditions, the negative 2DEG charge may be compensated by positive charges 28 that are located mainly at the interface of the AlGaN layer 12 (or the optional GaN cap layer, if one is present) and the dielectric layer 18, which forms a passivation layer.

Both a HEMT switch and a diode may suffer from the problem that the on-state resistance under dynamic conditions (e.g. switching, pulsed, RF) may be significantly higher than under static DC conditions. The reason for this high dynamic on-resistance is electron trapping 26 in the various layers of the device 10 (or at the interfaces between these various layers) such as the AlGaN layer 12 or GaN regions below the dielectric layer 18 or further dielectric layer(s) 24, during high-voltage stress. Because of the long time constant of this trapping, the trapped electrons 26 are still present shortly after stress removal and again, because of charge-neutrality, these trapped electrons will locally reduce the 2DEG concentration. This may result in a locally increased drift resistance, shortly after stress removal.

Part of the electron trapping may take place not in the top part of the device 10 but in the part of the device below the 2DEG 8. The GaN buffer layers 4 underneath the GaN layer 6 may be doped (e.g. with carbon and/or iron) and may form the p-side of a pn junction, with the drain and the 2DEG 8 connected to it forming the n-side of the junction. The p-type GaN layer 6 and the GaN buffer layers 4 may form a floating, high-resistive region having a local potential that depends on the resistive and capacitive coupling with the backside of the substrate 2, the gate contact 20 and the source contact 14. During high-voltage stress the drain voltage may be high, while the backside and source voltage may stay at zero, and the gate voltage may be below the threshold voltage. Because the doping (e.g. carbon and/or iron) in the GaN buffer layer(s) 4 may also act as an acceptor, electron trapping may take place in this depletion region. If the resistive path from a position in the GaN buffer layers (4) to either backside, source or gate is lower than that to the drain, the local voltage there will stay low, thus resulting in a large electric field across a depletion capacitance. As noted above, the depletion layer may form between the n-side (drain+2DEG) and the p-side (GaN buffer layers 4) and may result in large depletion charge and electron trapping. Because of charge neutrality, the density of electrons in the 2DEG 8 may accordingly decrease, which may be the major contribution to current collapse, i.e. a high on-state resistance.

Figure 3:
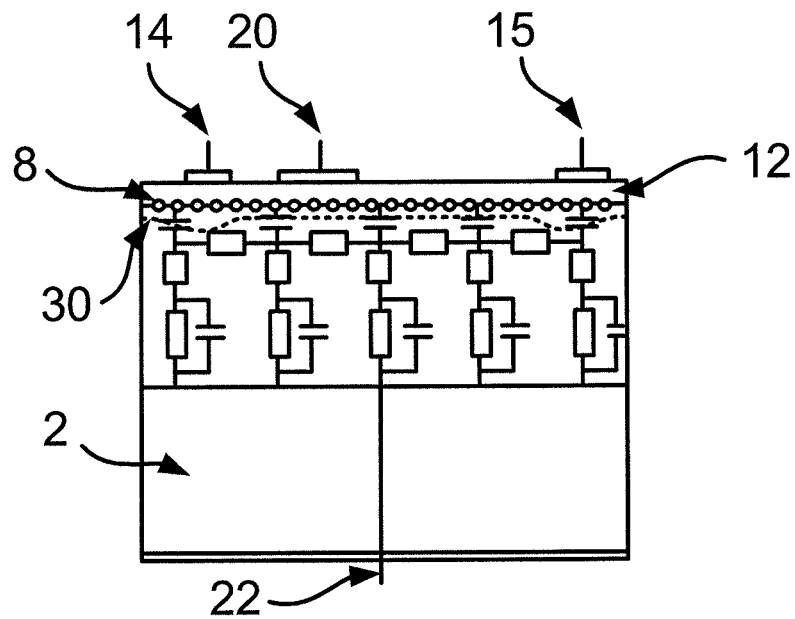
FIG. 3 schematically illustrates a model for the electrical characteristics of the depletion layer in a High Electron Mobility Device.
Figure 4:
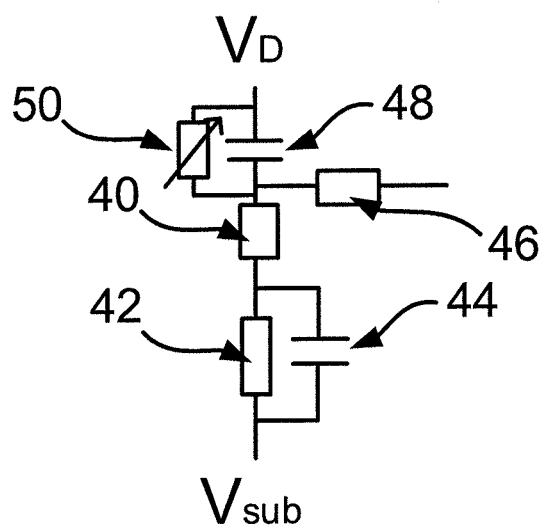
FIG. 4 shows a detail of the schematic model of FIG. 3.

The above mentioned depletion layer may be modelled with a network of resistors and capacitances as shown in FIGS. 3 and 4. In FIG. 3, a device of the kind described above, including a substrate 2 with an AlGaN layer 12 overlying a GaN region (including a GaN layer beneath the AlGaN layer 12 and a number of GaN buffer layers), a source contact 14, and drain contact 15 and a gate contact is shown, with the modelled network of resistors and capacitances overlaid. FIG. 3 also shows the 2DEG 8 and the above mentioned depletion region, an edge of which is denoted using the dotted line having reference numeral 30.

FIG. 4 shows a part of the modelled network, associated with a local part of the device. Note that this local part of the model may be repeated laterally along the device as represented in FIG. 3, to model the overall behaviour of the depletion layer. As shown in FIG. 4, the model includes resistors 40, 42, 46 and capacitors 44, 48. $V_D$ is the drain potential, while $V_{sub}$ is the potential applied to the backside of the substrate 2 as indicated by the reference numeral 22 in FIG. 3.

The potential distribution is determined by leakage paths in and out of the GaN region (modelled by the resistors 40, 42, 46, 50). The charge build-up is determined by internal capacitances (modelled by the capacitors 44, 48). In accordance with embodiments of this disclosure, the resistance of the leakage paths may be controlled by providing a plurality of passivation layers comprising different passivation materials on a major surface of the substrate 2 of a device 10. For instance, the dielectric layer 18 shown in FIG. 1 may comprise a plurality of passivation layers. Examples of the layouts of the passivation layers will be described below in the more detail.

The resistor 50 shown in FIGS. 3 and 4 is a variable resistor, which in accordance with embodiments of this disclosure, represents the ability to tune the resistance of the leakage path modelled by the resistor 50 by selection of the passivation material that contacts the area of the major surface of the substrate 2 located above that leakage path.

To prevent a large electric field across the above mentioned depletion layer, the leakage across the resistor 50 may be selected to be sufficiently high. However, a low vertical resistance may limit depletion of the 2DEG 8 in the off-state, which may increase the electric field from the 2DEG 8 to the gate. This may increase the leakage current and could decrease the lifetime of the device 10. In accordance with embodiments of this disclosure, tuning of the resistors 50 by the spatial distribution of two or more different passivation layers may lead to a reduced electric field and electron trapping without increasing the leakage or reducing lifetime.

Figure 5A:
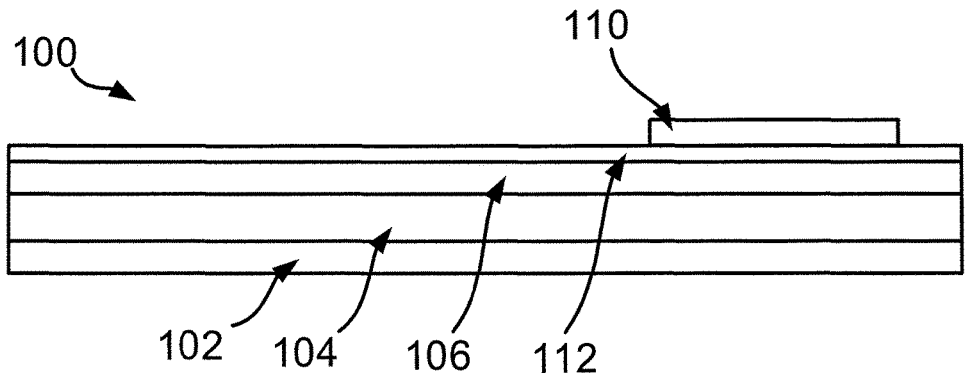
FIGS. 5A to 5C show a method of making a semiconductor device according to an embodiment of this disclosure.
Figure 5B:
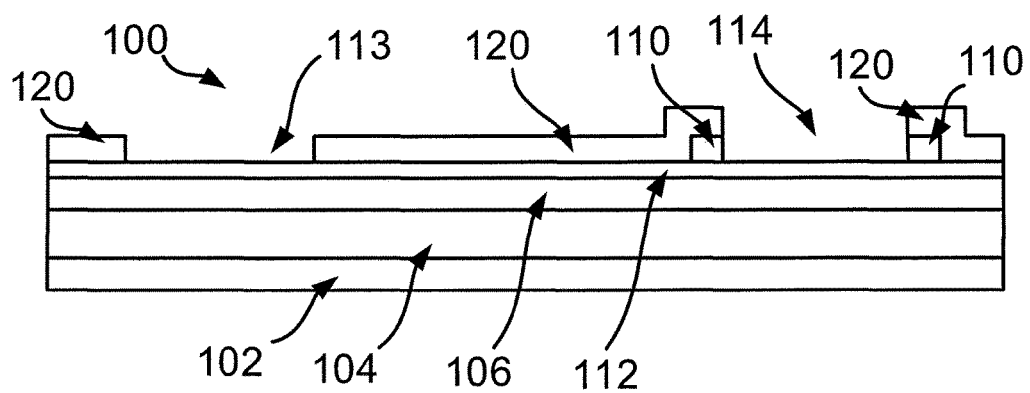
Figure 5C:
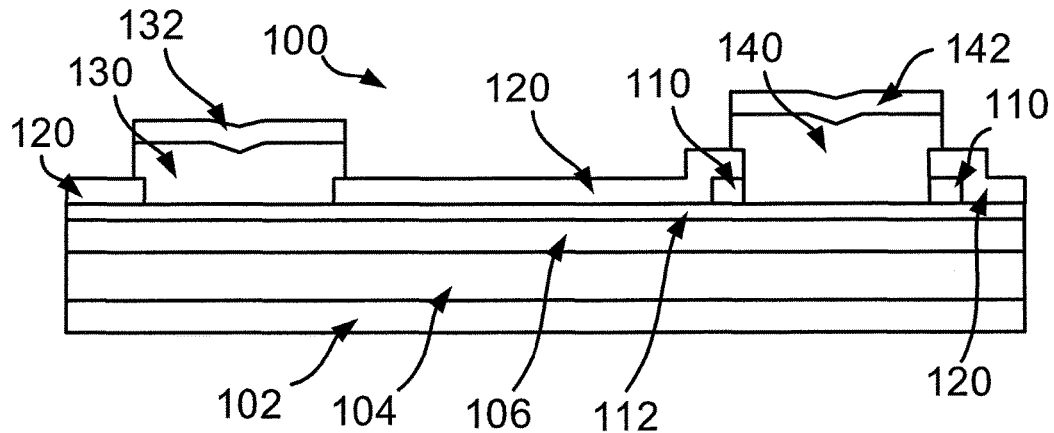

FIGS. 5A to 5C illustrate a method of making a semiconductor device 100 according to an embodiment of this disclosure.

In a first step shown in FIG. 5A, there is provided a substrate 102. The substrate 102 includes an AlGaN layer 112 and a GaN layer 106. The underlying part of the substrate 102 may, for instance, comprise silicon, silicon carbide, a glass or a ceramic. One or more buffer layers 104 may be located between the GaN layer 106 and the underlying part of the substrate 102, for matching the lattice of the GaN layer 106 to the underlying part of the substrate 102. The buffer layer(s) 106 may, for instance, comprise GaN and may be doped (e.g. with carbon and/or iron). In some examples, a GaN cap layer may be provided on the AlGaN layer 112, although this is no shown in the example of FIG. 5.

The AlGaN layer 112 is located on the GaN layer 106. As discussed previously, a two dimensional electron gas may form at an interface between the AlGaN layer 112 and the GaN layer 106. A current flowing within this 2DEG may form the basis for the operation of the device.

This example relates to the formation of the source and drain contacts of a High Electron Mobility Transistor (HEMT), and the provision of different passivation layers contacting different areas of the major surface of the substrate 102. It will be appreciated that a method of this kind may easily be applied also to the manufacture of a Schottky diode.

In FIG. 5, a first passivation layer 110 is provided on a major surface of the substrate 102. The major surface in this example is the (upper) surface of the AlGaN layer 112, although in other examples, the major surface may be the (upper) surface of a GaN cap layer, if one is present on the AlGaN layer 112 as noted above.

The first passivation layer 110 contacts the major surface of the substrate 102 in a first area. In the present example, this first area corresponds to an area of the device 100 in which the drain contact will subsequently be located. The first passivation layer 110 comprises a first passivation material. The types of passivation material that may be used will be discussed below. The first passivation layer 110 may be formed on the major surface using lithographic techniques involving depositing a layer of the first passivation material and then patterning it.

In a next step shown in FIG. 5B, a second passivation layer 120 is formed. The second passivation layer comprises a second passivation material, which is a different passivation material to the first passivation material. The second passivation layer 120 contacts the major surface of the substrate 102 in a second area. The second passivation layer 120 may be formed on the major surface using lithographic techniques involving depositing a layer of the second passivation material and then patterning it. Note that in some examples, as shown in FIGS. 5B and 5C, the passivation layers may overlap in some locations. Thus, in the present example, the second passivation layer 120 overlaps the first passivation layer 110 in the first are of the major surface. Where there is overlapping of this kind, only the lower of the two passivation layers typically contacts the major surface.

After the first and second passivation layers 110, 120 have been formed, openings may be formed in them to allow one of more contacts of the device 100 to make contact with the underlying parts of the device such as the AlGaN layer 112. In the present example, these openings include an opening 113 for receiving the source contact and an opening 114 for receiving the drain contact of a HEMT. Note that it is not envisaged that both openings 113, 114 need to extend through both passivation layers 110, 120. For instance, in FIG. 5B, while the opening 114 passes through both the first passivation layer 110 and the second passivation layer 120, the opening 113 passes through the second passivation layer 120 but not through first passivation layer 110. A further opening may also be formed intermediate the opening 113 and the opening 114, for receiving a Schottky gate contact of the HEMT, although this is not shown in the present example. It is also envisaged that the device may be a MISHEMT, in which case the gate contact may simply be located above one or both of the passivation layers, in between the source contact and the drain contact.

In a next step shown in FIG. 5C, the source contact and the drain contact of the device 100 may be formed. The source and drain contacts may be ohmic contacts. The source and drain contacts may be metallic. In the present example, the source contact and the drain contact both comprise the same materials, although this is not essential. The source contact in this example includes a Ti/Al electrode portion 130 which extends through the opening 113 in the second passivation layer 120 to contact the major surface of the substrate 102. It is envisaged that in some examples the electrode portion 130 may comprise a material other than Ti/Al, such as Ta/Al. The source contact may also include a layer 132 of TiW(N) located on the electrode portion 130, which may act as a diffusion barrier, to avoid impurities entering the electrode portion 130 during manufacture (in other examples, the layer 132 may comprise e.g. TiN, TiW or Pt). Similarly, the drain contact in this example includes a Ti/Al electrode portion 140 which extends through the opening 114 in the first and second passivation layers 110, 120 to contact the major surface of the substrate 102. Like the electrode portion 130 of the source contact, it is envisaged that in some examples the electrode portion 140 of the drain contact may comprise a material other than Ti/Al, such as Ta/Al. Also like the source contact, the drain contact may include a layer 142 of TiW(N) located on the electrode portion 140 (in other examples, the layer 132 may comprise e.g. TiN, TiW or Pt).

The resulting device 100 has two passivation layers 110, 120, which each contact the major surface of the substrate 100 in respective areas. In this example, the area in which the first passivation layer 110 contacts the major surface of the substrate 102 is adjacent a first contact (the drain contact) of the device 100. The area in which the second passivation layer 120 contacts the major surface of the substrate 102 may be adjacent a second contact (the source contact) of the device 100. As noted previously, a gate contact may be located between the source contact and the drain contact. In the present example, the gate contact may be located in an opening in the second passivation layer 120 (or on the second passivation layer 120, in the case of a MISHEMT).

Figure 6A:
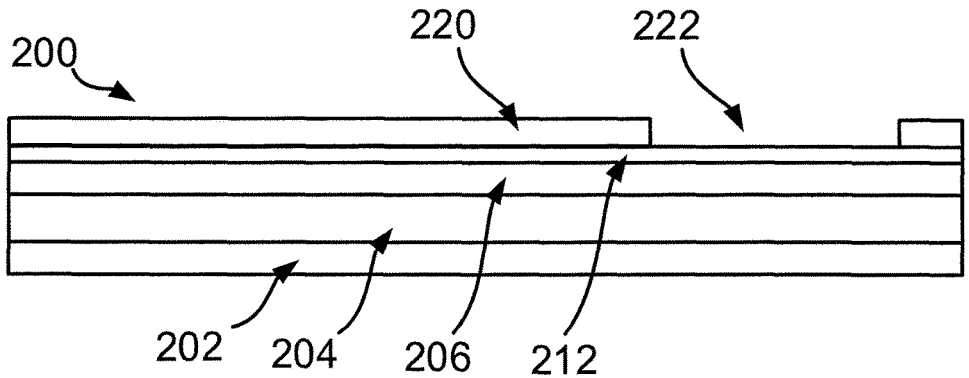
FIGS. 6A to 6C show a method of making a semiconductor device according to another embodiment of this disclosure.
Figure 6B:
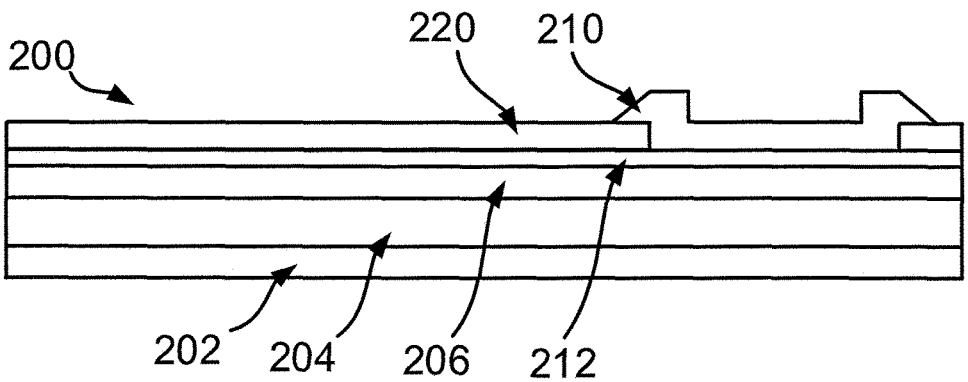
Figure 6C:
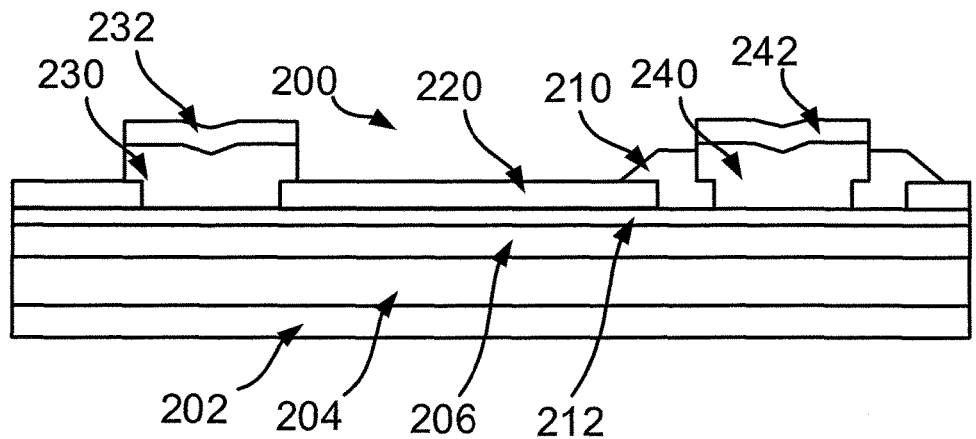

FIGS. 6A to 6C illustrate a method of making a semiconductor device according to another embodiment of this disclosure.

In a first step shown in FIG. 6A, there is provided a substrate 202, which may be similar to the substrate described above in relation to FIGS. 5A to 5C. The substrate 202 includes an AlGaN layer 212 and a GaN layer 206. The underlying part of the substrate 202 may, for instance, comprise silicon, silicon carbide, a glass or a ceramic. One or more buffer layers 204 may be located between the GaN layer 206 and the underlying part of the substrate 202, for matching the lattice of the GaN layer 206 to the underlying part of the substrate 202. The buffer layer(s) 206 may, for instance, comprise GaN and may be doped (e.g. with carbon and/or iron). In some examples, a GaN cap layer may be provided on the AlGaN layer 212, although this is no shown in the example of FIG. 6.

The AlGaN layer 212 is located on the GaN layer 206. As discussed previously, a two dimensional electron gas may form at an interface between the AlGaN layer 212 and the GaN layer 206. A current flowing within this 2DEG may form the basis for the operation of the device.

As with FIG. 5, this example relates to the formation of the source and drain contacts of a High Electron Mobility Transistor (HEMT), and the provision of different passivation layers contacting different areas of the major surface of the substrate 202. It will be appreciated that a method of this kind may easily be applied also to the manufacture of a Schottky diode.

In FIG. 6A, a second passivation layer 220 is initially provided on a major surface of the substrate 202. The major surface in this example is the (upper) surface of the AlGaN layer 212, although in other examples, the major surface may be the (upper) surface of a GaN cap layer, if one is present on the AlGaN layer 212 as noted above.

The second passivation layer 220 contacts the major surface of the substrate 102 in a second area. In the present example, this second area corresponds to an area of the device 100 nonadjacent where the drain contact will subsequently be located. The second passivation layer 220 comprises a second passivation material. The second passivation layer 220 may be formed on the major surface using lithographic techniques involving depositing a layer of the second passivation material and then patterning it. As shown in FIG. 6A after depositing the second material, the second passivation layer may be patterned to form an opening 222. This opening 222 will receive the first passivation layer, to be described below.

In a next step shown in FIG. 6B, the first passivation layer 210 is formed. The first passivation layer 210 comprises a first passivation material, which is a different passivation material to the second passivation material. The first passivation layer 210 contacts the major surface of the substrate 202 in a first area, which corresponds to the location of the opening 222 shown in FIG. 6A. The first passivation layer 210 may be formed using lithographic techniques involving depositing a layer of the first passivation material and then patterning it. Note that the first passivation layer 210 overlaps the second passivation layer 220 in some locations. Where there is overlapping of this kind, only the lower of the two passivation layers typically contacts the major surface.

After the first and second passivation layers 210, 220 have been formed, openings may be formed in them to allow one of more contacts of the device 200 to make contact with the underlying parts of the device such as the AlGaN layer 212. These openings may be formed lithographically. In the present example, an opening is made for each of the source contact and the drain contact to be described below, in a manner similar to that described above in relation to FIG. 5. In this example, the opening for the source contact extends through the second passivation layer 220 but not the first passivation layer 210, while the opening for the drain contact extends through the first passivation layer 210 but not the second passivation layer 220. As described above in relation to FIG. 5, a further opening may also be formed intermediate the source contact and drain contact, for receiving a Schottky gate contact of the HEMT, although this is not shown in the present example. Again it is envisaged that the device may be a MISHEMT, in which case the gate contact may simply be located above one or both of the passivation layers, in between the source contact and the drain contact.

In a next step shown in FIG. 6C, the source contact and the drain contact of the device 200 may be formed. As may be seen in FIG. 6C, the source contact and the drain contact may be configured similarly to the source and drain contacts described above in relation to FIG. 5. Thus, the source contact in this example may include a Ti/Al (or, e.g. Ta/Al as noted above) electrode portion 230 and a layer 232 of TiW(N) (or, e.g. TiN, TiW, Pt as noted above) located on the electrode portion 230, which may act as a diffusion barrier, while the drain contact may include a Ti/Al (or, e.g. Ta/Al as noted above) electrode portion 240 and a layer 242 of TiW(N) (or, e.g. TiN, TiW, Pt as noted above) located on the electrode portion 240, which may again act as a diffusion barrier.

The resulting device 200 has two passivation layers 210, 220, which each contact the major surface of the substrate 200 in respective areas. In this example, the area in which the first passivation layer 210 contacts the major surface of the substrate 202 is adjacent a first contact (the drain contact) of the device 200. The area in which the second passivation layer 220 contacts the major surface of the substrate 202 may be adjacent a second contact (the source contact) of the device 200. As noted previously, a gate contact may be located between the source contact and the drain contact. In the present example, the gate contact may be located in an opening in the second passivation layer 220 (or on the second passivation layer 220, in the case of a MISHEMT).

Figure 7A:
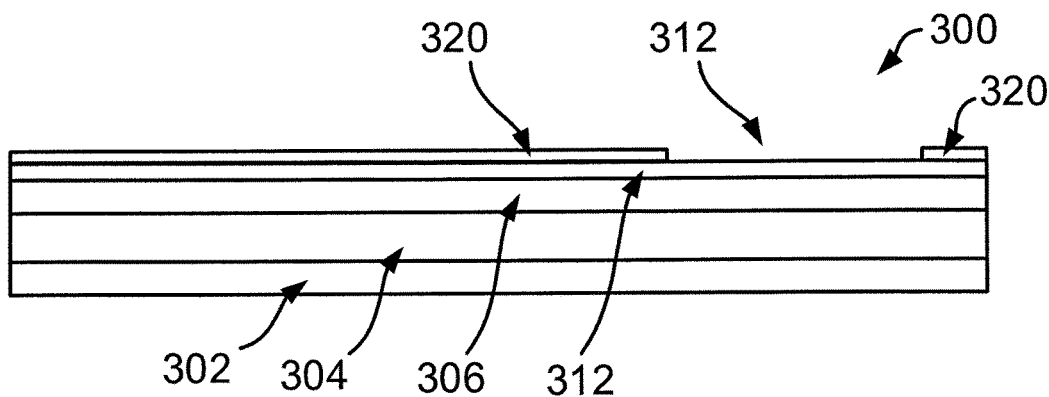
FIGS. 7A to 7C show a method of making a semiconductor device according to a further embodiment of this disclosure.
Figure 7B:
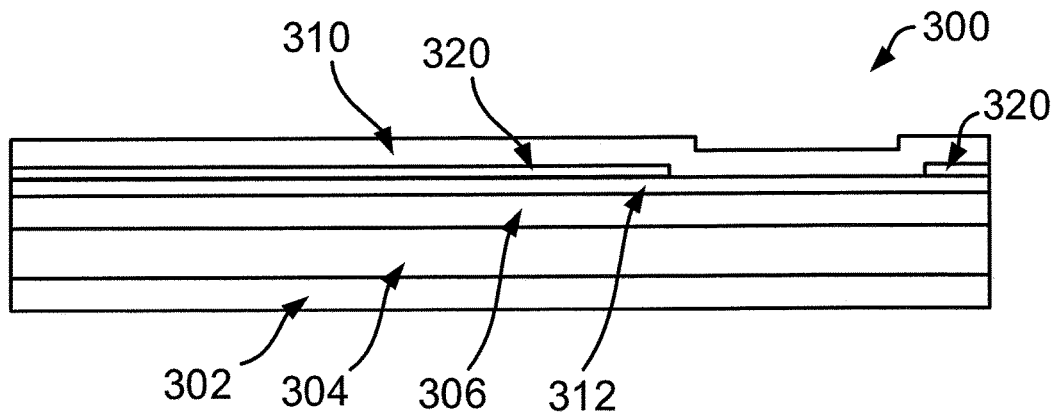
Figure 7C:
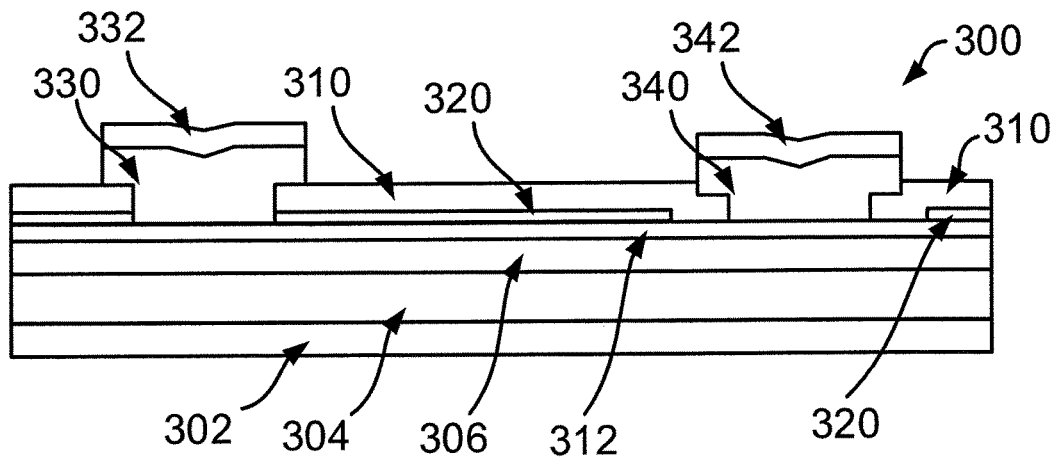

FIGS. 7A to 7C illustrate a method of making a semiconductor device according to a further embodiment of this disclosure.

In a first step shown in FIG. 7A, there is provided a substrate 302, which may be similar to the substrate described above in relation to FIGS. 5A to 5C and 6A to 6C. The substrate 302 includes an AlGaN layer 312 and a GaN layer 306. The underlying part of the substrate 302 may, for instance, comprise silicon, silicon carbide, a glass or a ceramic. One or more buffer layers 304 may be located between the GaN layer 306 and the underlying part of the substrate 302, for matching the lattice of the GaN layer 306 to the underlying part of the substrate 302. The buffer layer(s) 306 may, for instance, comprise GaN and may be doped (e.g. with carbon and/or iron). In some examples, a GaN cap layer may be provided on the AlGaN layer 312, although this is no shown in the example of FIG. 7.

The AlGaN layer 312 is located on the GaN layer 306. As discussed previously, a two dimensional electron gas may form at an interface between the AlGaN layer 312 and the GaN layer 306. A current flowing within this 2DEG may form the basis for the operation of the device.

As with FIGS. 5 and 6, this example relates to the formation of the source and drain contacts of a High Electron Mobility Transistor (HEMT), and the provision of different passivation layers contacting different areas of the major surface of the substrate 302. It will be appreciated that a method of this kind may easily be applied also to the manufacture of a Schottky diode.

In FIG. 7A, a second passivation layer 320 is initially provided on a major surface of the substrate 302. As with FIGS. 5 and 6, the major surface in this example is the (upper) surface of the AlGaN layer 312, although in other examples, the major surface may be the (upper) surface of a GaN cap layer, if one is present on the AlGaN layer 312.

The second passivation layer 320 contacts the major surface of the substrate 302 in a second area. In the present example, this second area corresponds to an area of the device 300 nonadjacent where the drain contact will subsequently be located. The second passivation layer 320 comprises a second passivation material. The second passivation layer 320 may be formed on the major surface using lithographic techniques involving depositing a layer of the second passivation material and then patterning it. As shown in FIG. 7A after depositing the second material, the second passivation layer may be patterned to form an opening 312. This opening 312 will receive the first passivation layer, to be described below.

In a next step shown in FIG. 7B, the first passivation layer 310 is formed. The first passivation layer 310 comprises a first passivation material, which is a different passivation material to the second passivation material. The first passivation layer 310 contacts the major surface of the substrate 302 in a first area, which corresponds to the location of the opening 312 shown in FIG. 7A. The first passivation layer 310 may be formed using lithographic techniques involving depositing a layer of the first passivation material and then patterning it. While in the example of FIG. 6, the first passivation layer 210 overlapped the second passivation layer 220 in a limited area, near to the drain contact, in the present example, note that the first passivation layer 310 may extend further across the second passivation layer 320, and indeed may completely cover it, at least in an active area of the device 300. Where there is overlapping of this kind, only the lower of the two passivation layers typically contacts the major surface. Hence, although there may be significant overlap of the passivation layers 310, 320, in the present example only the first 310 of the passivation layers contacts the major surface of the device 300 in a first area and only the second 320 of the passivation layers contacts the major surface of the device 300 in a second area.

After the first and second passivation layers 310, 320 have been formed, openings may be formed in them to allow one of more contacts of the device 300 to make contact with the underlying parts of the device 300 such as the AlGaN layer 312. These openings may be formed lithographically. In the present example, an opening is made for each of the source contact and the drain contact to be described below, in a manner similar to that described above in relation to FIGS. 5 and 6. Note that although the opening for the drain contact extends through the first passivation layer 310 but not the second passivation layer 320, a consequence of the fact that the first passivation layer 310 overlaps with the second passivation layer 320 in the second area of the device 300 is that the opening for the source contact extends through both the first passivation layer 310 and the second passivation layer 320.

As described above in relation to FIGS. 5 and 6, a further opening may also be formed intermediate the source contact and drain contact, for receiving a Schottky gate contact of the HEMT, although this is not shown in the present example. Again it is envisaged that the device may be a MISHEMT, in which case the gate contact may simply be located above one or both of the passivation layers, in between the source contact and the drain contact.

In a next step shown in FIG. 7C, the source contact and the drain contact of the device 300 may be formed. As may be seen in FIG. 7C, the source contact and the drain contact may be configured similarly to the source and drain contacts described above in relation to FIGS. 5 and 6. Thus, the source contact in this example may include a Ti/Al (or, e.g. Ta/Al as noted above) electrode portion 330 and a layer 332 of TiW(N) (or, e.g. TiN, TiW, Pt as noted above) located on the electrode portion 330, which may act as a diffusion barrier, while the drain contact may include a Ti/Al (or, e.g. Ta/Al as noted above) electrode portion 340 and a layer 342 of TiW(N) (or, e.g. TiN, TiW, Pt as noted above) located on the electrode portion 340, which may again act as a diffusion barrier.

The resulting device 300 has two passivation layers 310, 320, which each contact the major surface of the substrate 300 in respective areas. In this example, the area in which the first passivation layer 310 contacts the major surface of the substrate 302 is adjacent a first contact (the drain contact) of the device 300. The area in which the second passivation layer 320 contacts the major surface of the substrate 302 may be adjacent a second contact (the source contact) of the device 300. As noted previously, a gate contact may be located between the source contact and the drain contact. In the present example, the gate contact may be located in an opening in both first passivation layer 310 and the second passivation layer 320 (or on the first and second passivation layers 310, 320, in the case of a MISHEMT).

Although the illustrative examples given above include two passivation layers, it is envisaged that more than two passivation layers may be provided. Each passivation layer may comprise a respective passivation material, which is different to the passivation materials of the other passivation layers. The provision of more than two passivation layers may allow for more localised tailoring of the resistance of the leakage path represented by the variable resistor 50 described above in relation to FIG. 4. Lithographic techniques may be used to deposit and pattern the various passivation layers so that the contact the major surface of the substrate of the device in the desired areas.

In some examples the first passivation layer, which may substantially surround a first of the electrical contacts on the major surface (e.g. the drain contact of a HEMT or the cathode of a Schottky diode as described above) may be asymmetrically arranged with respect to that contact. For instance, the first passivation layer may include an extension located on one side of the first electrical contact. This extension may extend toward another electrical contact of the device (e.g. the gate contact of a HEMT or the anode of a Schottky diode).

In some examples the first area of the major surface, which is contacted by the first passivation layer, may include one or more islands located between two of the electrical contacts of the device. For instance, the islands may be located between the drain contact and gate contact of a HEMT, or between the anode and cathode of a Schottky diode. These islands may be used to tailor the local leakage path resistance in the manner described above. The islands may contact the major surface through openings located in another passivation layer (e.g. a second passivation layer of the kind described above), which is comprised of a different passivation material. The islands may be arranged in an array. The islands may comprise, for instance, dots or stripes when viewed from above the major surface of the substrate.

As noted previously, the passivation layers of a device according to embodiments of this disclosure may comprise different passivation materials. For instance, at least some of the passivation layers may comprise silicon nitride that include different proportions of silicon. In one example, one of the passivation materials may be stoichiometric silicon nitride and another of the passivation materials may be a composition of silicon nitride that is more silicon rich than stoichiometric silicon nitride. Passivation layers of this kind may be deposited using, for instance, Low Pressure Chemical Vapour Deposition (LPCVD) and/or Plasma Enhanced Chemical Vapour Deposition (PECVD), and the proportion of silicon in the passivation material may be varied during the deposition process.

For instance, in accordance with embodiments of this disclosure, it has been determined that the use of different silicon nitride passivation layers can affect the conductivity of the vertical defects in the GaN layers of a semiconductor device. If the vertical defects are conductive enough, they may locally short the above mentioned pn junction so that no depletion layer can build up locally. Stoichiometric LPCVD silicon nitride, Si3N4, has typically a refractive index of around 2.0 and a stress of around 1000 MPa. Stoichiometric silicon nitride can result in lowly-conducting vertical defects, which may lead to a strong dynamic on-resistance, together with a very low reverse bias leakage from the drain of the device to gate of the device. A more silicon rich LPCVD silicon nitride, which may for example be deposited by changing the standard gas flows of dichloresilane (DCS) and ammonia (NH3) that may be used to deposit stoichiometric silicon nitride. One such composition of silicon rich silicon nitride may have a refractive index of 2.2 and a stress of 100 MPa. By using a silicon rich, low stress silicon nitride more leaky vertical defects (corresponding to a lower value for the resistor 50 shown in FIG. 4) and a lower dynamic on-resistance for the device may result. Conversely, using a less silicon rich, high stress silicon nitride, less leaky vertical defects (corresponding to a higher value for the resistor 50 shown in FIG. 4) and a higher dynamic on-resistance for the device may result.

In some embodiments, a first passivation layer located adjacent a drain contract (in the case of a HEMT) or cathode (in the case of a Schottky diode) of the device may comprise a relatively silicon rich composition of silicon nitride (for increased leakage as noted above, near the drain or cathode), while a second passivation layer located adjacent a gate contact (in the case of a HEMT) or anode (in the case of a Schottky diode) may comprise a composition of silicon nitride that is less silicon rich (for lower leakage as noted above, near the gate or anode) than the passivation material of the first passivation layer (e.g. the second passivation material may comprise stoichiometric silicon nitride). For instance, in examples of the kind described above in relation to FIGS. 5 to 7, the passivation material of the first passivation layers 110, 210, 310, may comprise silicon nitride that is more silicon rich than the passivation material of the first passivation layers 120, 220, 320. A device having passivation layers of this kind may allow for optimisation of the trade-off between leakage current and current collapse/dispersion, as discussed previously.

Although examples of this disclosure have been described in the context of passivation materials comprising SiN, it is envisaged that other passivation materials may be used. For instance, in some examples, it is envisaged that the passivation layers of the device may comprise passivation materials such as silicon oxide or Semi-Insulating Polycrystalline Silicon (SIPOS). Further examples include atomic layer depositions of materials such as AlN. Passivation materials that produce more leaky vertical defects may be located near the drain contract (in the case of a HEMT) or cathode (in the case of a Schottky diode) of the device while passivation materials that produce less leaky vertical defects may be located near the gate (in the case of a HEMT) or anode (in the case of a Schottky diode) of the device in a manner similar to that described above.

Accordingly, there has been described a semiconductor device and a method of making the same. The device includes a substrate including an AlGaN layer located on a GaN layer for forming a two dimensional electron gas at an interface between the AlGaN layer and the GaN layer. The device also includes a plurality of electrical contacts located on a major surface of the substrate. The device further includes a plurality of passivation layers located on the major surface of the substrate. The plurality of passivation layers includes a first passivation layer of a first passivation material contacting a first area of the major surface and a second passivation layer of a second passivation material contacting a second area of the major surface. The first and second passivation materials are different passivation materials. The different passivation materials may be compositions of silicon nitride that include different proportions of silicon.

Although particular embodiments of this disclosure have been described, it will be appreciated that many modifications/additions and/or substitutions may be made within the scope of the claims.

The invention claimed is:

1. A semiconductor device comprising:
a substrate including an AlGaN layer located on a GaN layer for forming a two dimensional electron gas at an interface between the AlGaN layer and the GaN layer;
a plurality of electrical contacts located on a major surface of the substrate; and
a plurality of passivation layers located on the major surface of the substrate, the plurality of passivation layers comprising a first passivation layer comprising a first passivation material contacting a first area of the major surface and a second passivation layer comprising a second passivation material contacting a second area of the major surface, wherein the first passivation material comprises a silicon nitride composition and the second passivation material comprises a silicon nitride composition having a different proportion of silicon from the first passivation material wherein the passivation layers define a leakage path in the substrate, and wherein the leakage path has a resistance that is varied by a spatial distribution of the passivation layers.

2. The semiconductor device of claim 1, wherein the first area is adjacent a first electrical contact of said electrical contacts on the major surface and wherein the second area is nonadjacent the first of said electrical contacts on the major surface.

3. The semiconductor device of claim 2, wherein the first area substantially surrounds the first electrical contact of said electrical contacts on the major surface.

4. The semiconductor device of claim 2, wherein the first passivation layer is asymmetrically arranged with respect to the first electrical contact of said electrical contacts to include an extension located on one side of the first electrical contact, wherein the extension extends toward another electrical contact of the semiconductor device.

5. The semiconductor device claim 2, wherein the semiconductor device comprises a High Electron Mobility Transistor (HEMT), and wherein first electrical contact comprises a drain contact of the HEMT.

6. The semiconductor device claim 2, wherein the semiconductor device comprises a Schottky diode, and wherein the first electrical contact comprises a cathode of the Schottky diode.

7. The semiconductor device of claim 1, wherein the first area includes one or more islands located between two of said electrical contacts of the semiconductor device.

8. The semiconductor device of claim 1, wherein the different passivation materials comprise compositions of silicon nitride that include different proportions of silicon.

9. The semiconductor device of claim 8, wherein one of the passivation materials comprises stoichiometric silicon nitride and wherein another of the passivation materials comprises a composition of silicon nitride that is more silicon rich than stoichiometric silicon nitride.

10. The semiconductor device of claim 1, wherein the passivation layers overlap in at least some locations on the major surface.

11. The semiconductor device of claim 1, wherein said electrical contacts of the semiconductor device extend through openings in the passivation layers to make contact with the substrate.

12. The semiconductor device of claim 1, wherein the major surface of the substrate comprises a surface of the AlGaN layer or a surface of a GaN cap layer located on the AlGaN layer.

13. A method of making a semiconductor device, the method comprising:
providing a substrate including an AlGaN layer located on a GaN layer for forming a two dimensional electron gas at an interface between the AlGaN layer and the GaN layer;
forming a plurality of electrical contacts located on a major surface of the substrate; and
forming a plurality of passivation layers located on the major surface of the substrate, the plurality of passivation layers comprising
a first passivation layer comprising a first passivation material contacting a first area of the major surface, and
a second passivation layer comprising a second passivation material contacting a second area of the major surface,
wherein the first passivation material comprises a silicon nitride composition and the second passivation material comprises a silicon nitride composition having a different proportion of silicon from the first passivation material, wherein the first and second passivation layers define a leakage path in the substrate, and wherein the leakage path has a resistance that is varied by a spatial distribution of the first and second passivation layers.

14. The method of claim 13, wherein one of the passivation materials comprises stoichiometric silicon nitride, and wherein another of the passivation materials comprises a composition of silicon nitride that is more silicon rich than stoichiometric silicon nitride.

\* \* \* \* \*